United States Patent
Wallner et al.

(10) Patent No.: US 7,663,964 B2
(45) Date of Patent: Feb. 16, 2010

(54) MEMORY DEVICE, MEMORY SYSTEM AND METHOD OF OPERATING SUCH

(75) Inventors: Paul Wallner, Prien (DE); Peter Gregorius, Munich (DE)

(73) Assignee: Qimonda AG, Munich (DE)

( * ) Notice: Subject to any disclaimer, the term of this patent is extended or adjusted under 35 U.S.C. 154(b) by 374 days.

(21) Appl. No.: 11/735,971

(22) Filed: Apr. 16, 2007

(65) Prior Publication Data
US 2007/0280007 A1  Dec. 6, 2007

(30) Foreign Application Priority Data
Apr. 15, 2006  (DE) .................. 10 2006 017 767

(51) Int. Cl.
*G11C 8/00* (2006.01)
(52) U.S. Cl. .......................... 365/233.1; 365/189.05; 365/236
(58) Field of Classification Search ............. 365/233.1, 365/189.05, 236
See application file for complete search history.

(56) References Cited

U.S. PATENT DOCUMENTS

| | | | |
|---|---|---|---|
| 6,166,990 A * | 12/2000 | Ooishi et al. | 365/233.11 |
| 6,542,416 B1 | 4/2003 | Hampel et al. | |
| 6,643,193 B2 * | 11/2003 | Yamaki et al. | 365/189.09 |
| 6,665,222 B2 * | 12/2003 | Wright et al. | 365/194 |
| 2005/0081085 A1 | 4/2005 | Ellis et al. | |

OTHER PUBLICATIONS

JEDEC Standard, Double Data Rate (DDR) SDRAM Specification, JESD79-D, (Revision of JESD79C), JEDEC Solid State Technology Association, 2500 Wilson Boulevard, Arlington, VA 22201-3834, Jan. 2004, pp. 1, 5, 8 and 9.

* cited by examiner

*Primary Examiner*—Tuan T. Nguyen
(74) *Attorney, Agent, or Firm*—Patterson & Sheridan, L.L.P.

(57) ABSTRACT

A memory device including a memory cell array; an input circuit providing drive signals to the memory cell array dependent on externally received command data; an output buffer buffering data read out from the memory cell array; and a timer driving the output buffer such that the buffered data are provided at an output after an adjustable time interval has elapsed, the adjustable time interval beginning with the provision of the drive signals.

25 Claims, 12 Drawing Sheets

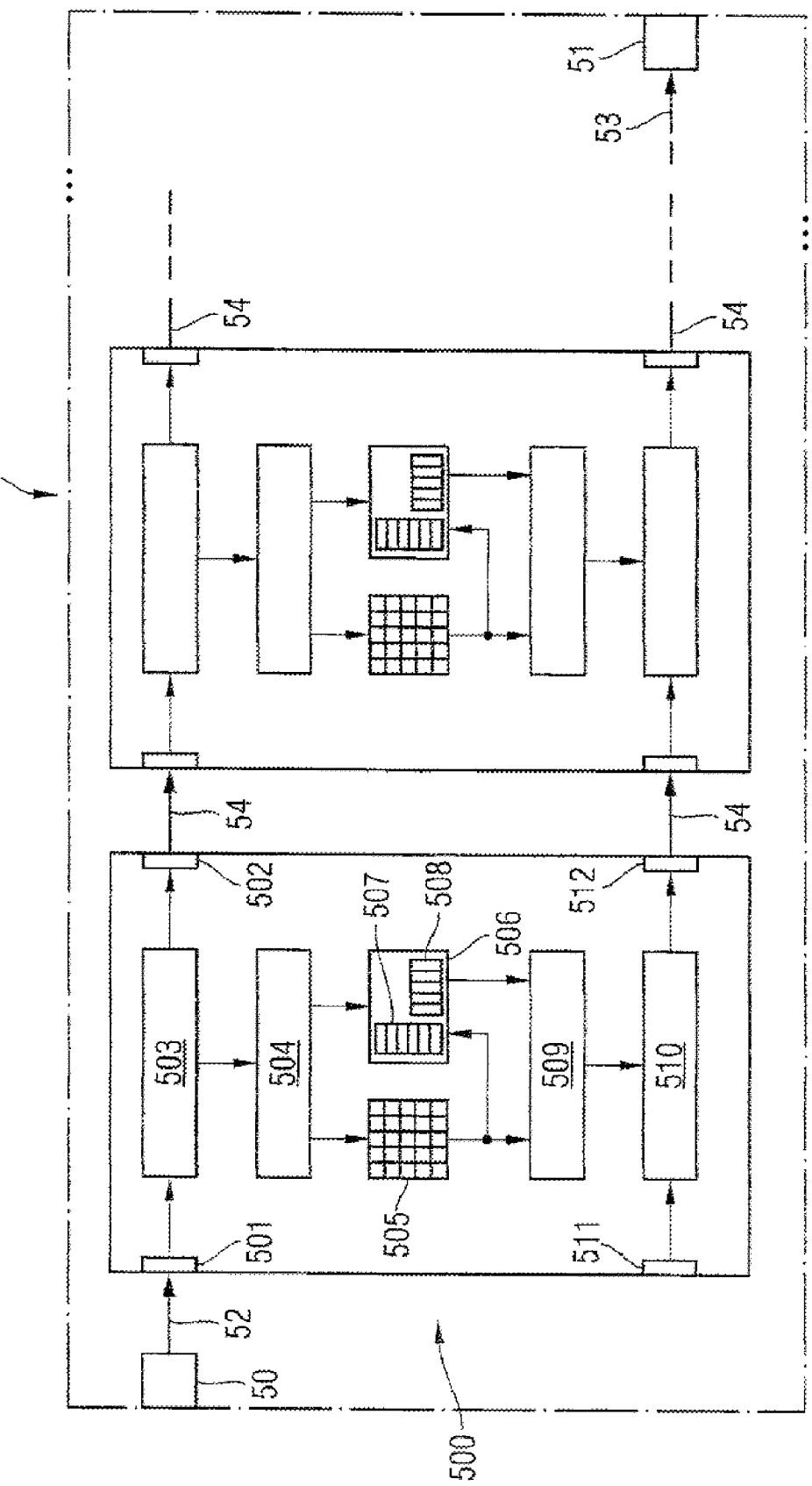

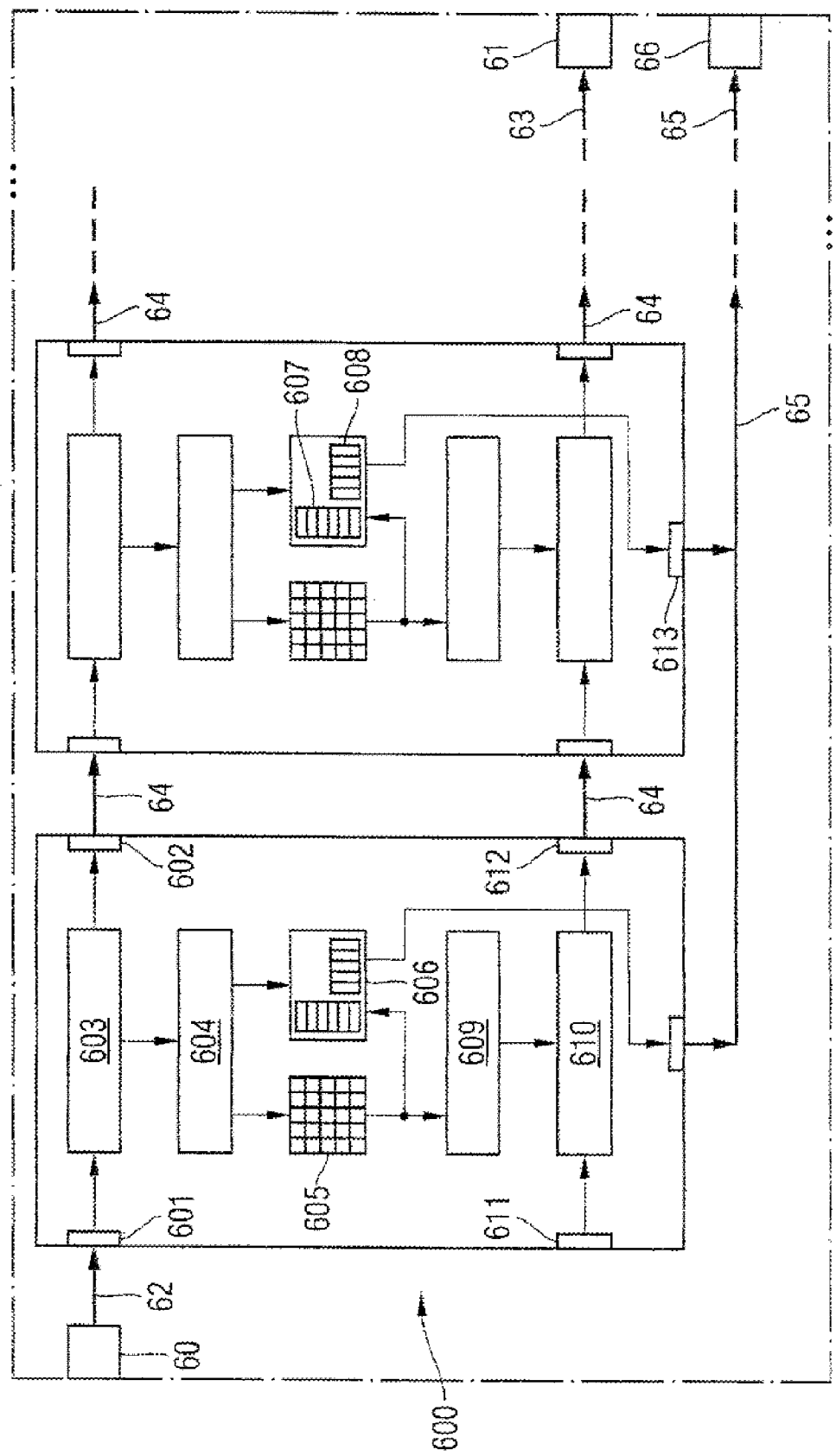

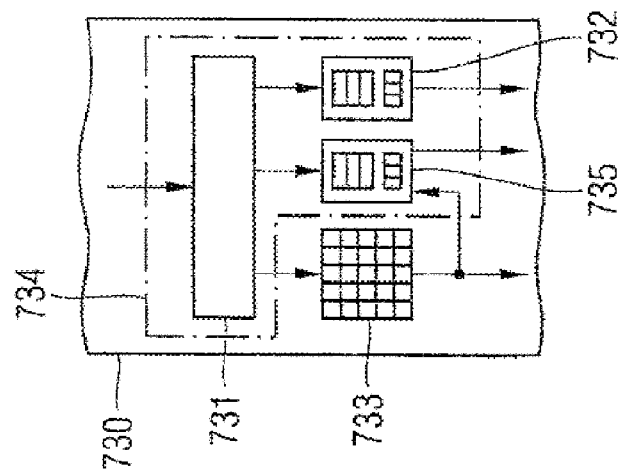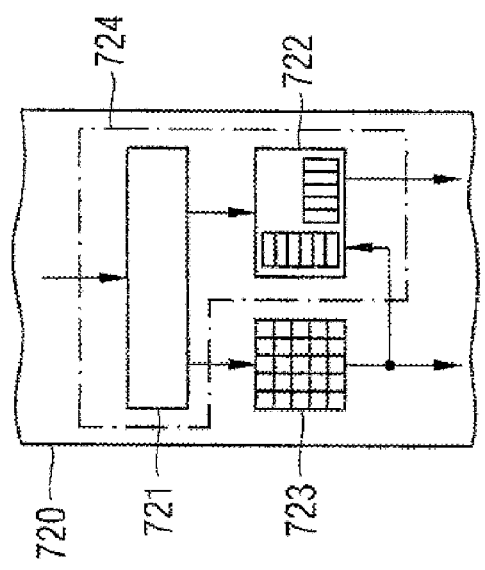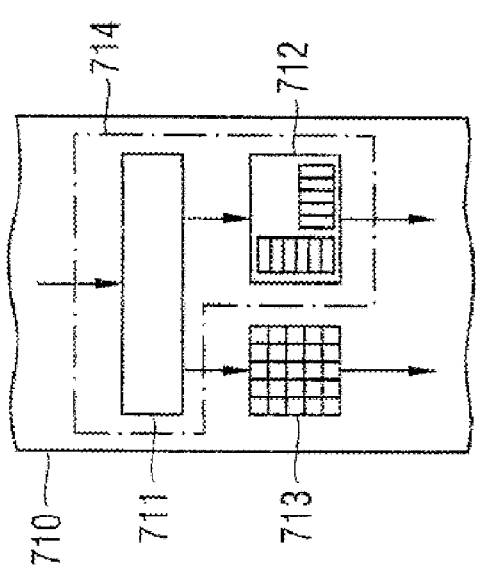

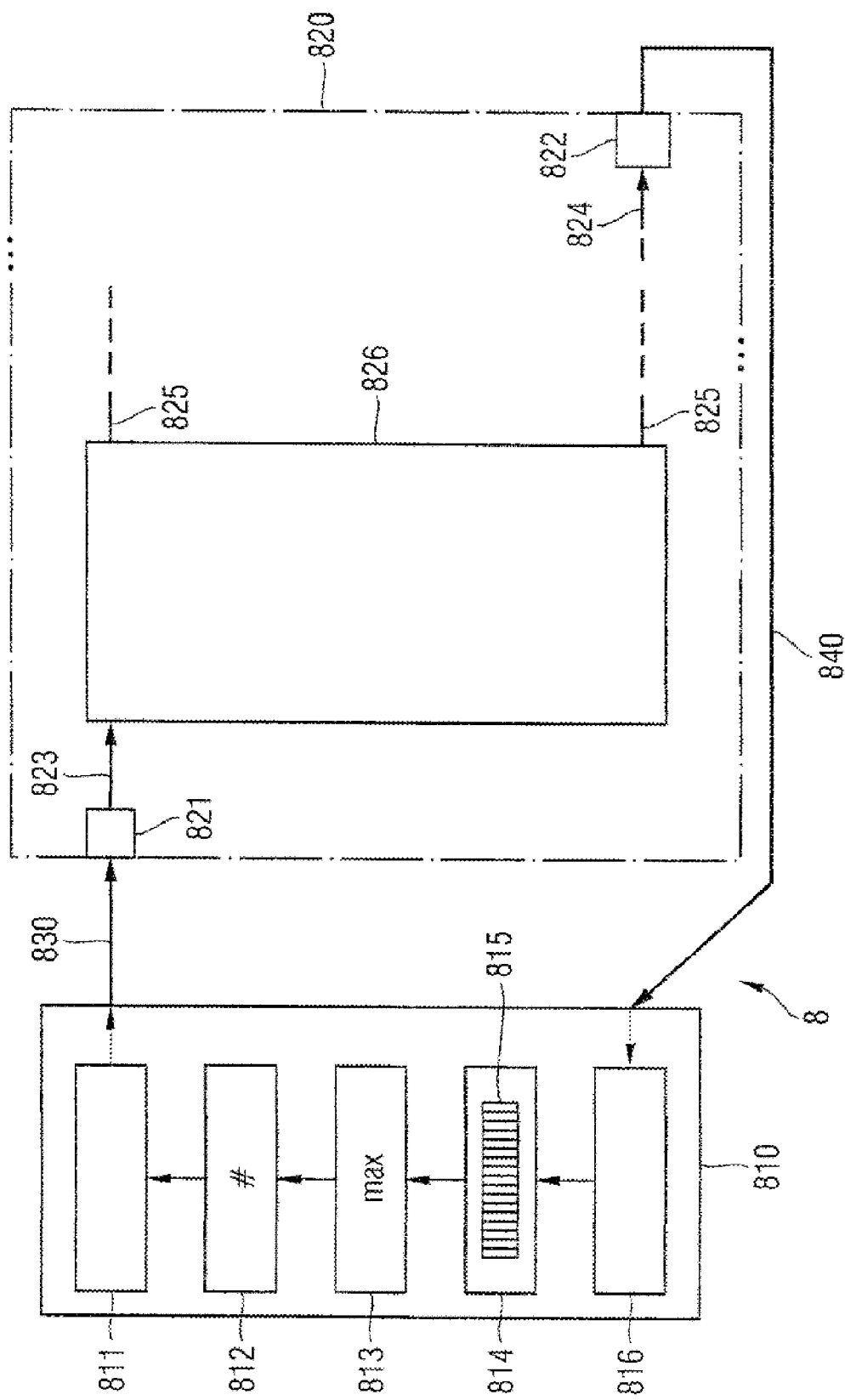

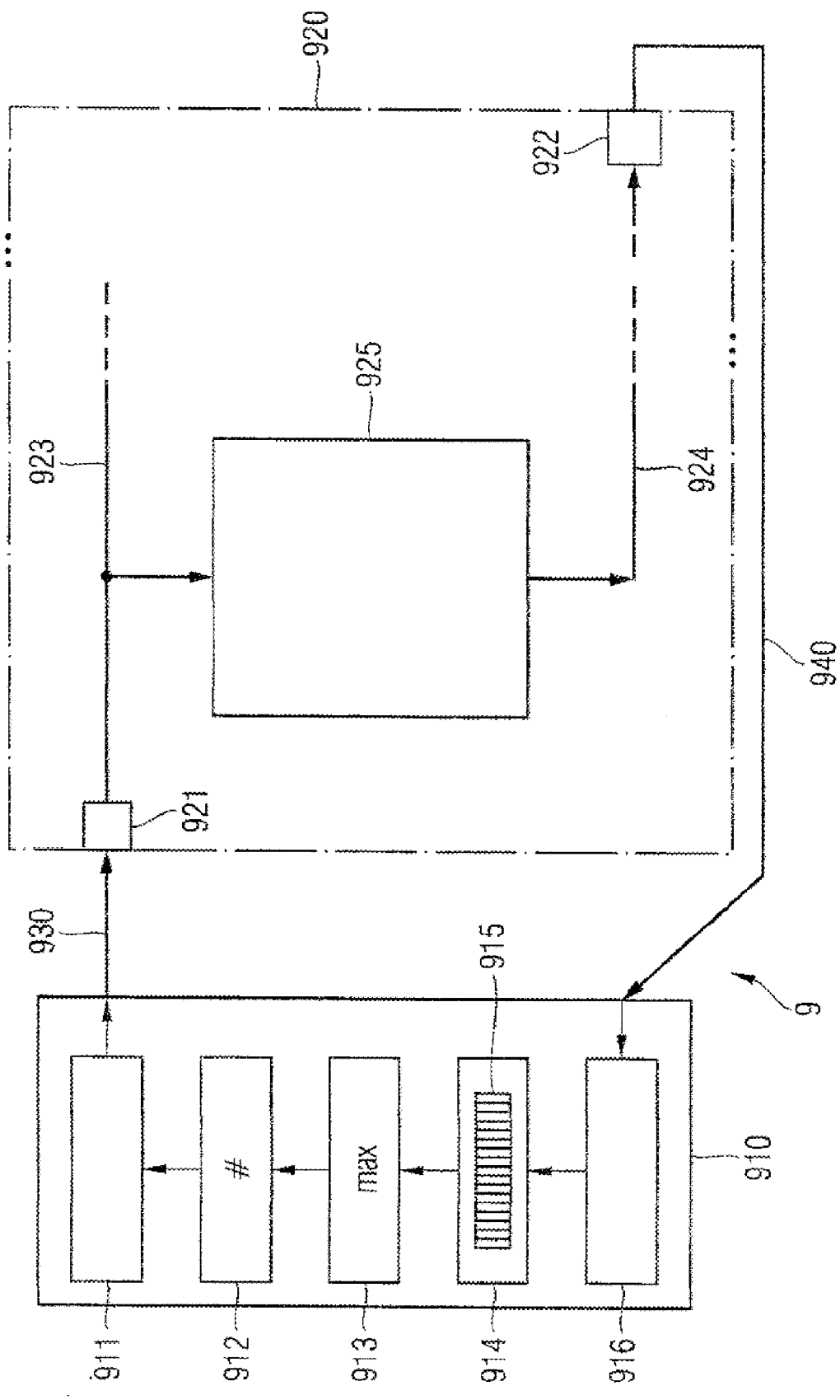

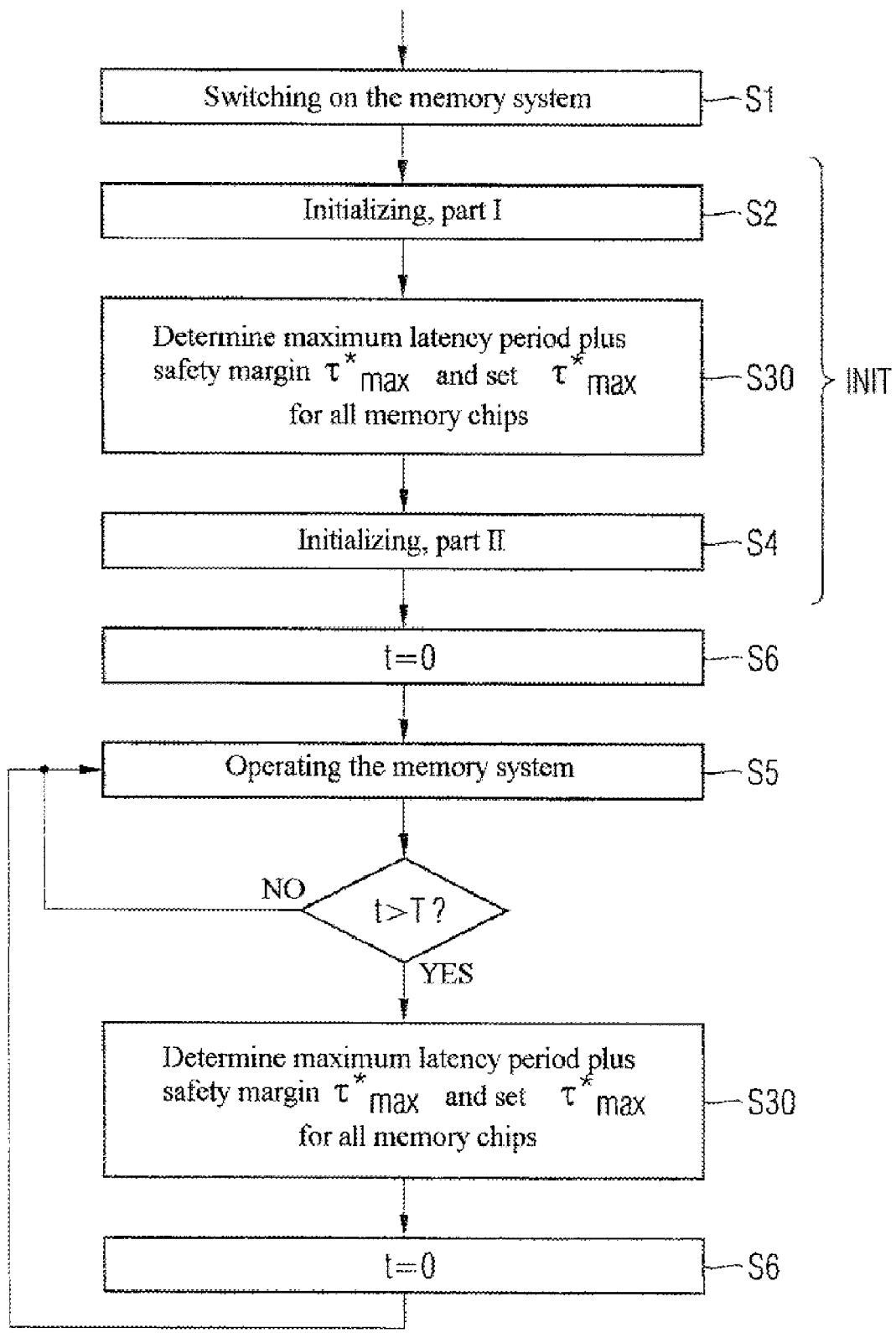

MEMORY DEVICE, MEMORY SYSTEM AND METHOD OF OPERATING SUCH

CROSS-REFERENCE TO RELATED APPLICATIONS

This application claims foreign priority benefits under 35 U.S.C. §119 to co-pending German patent application number DE 10 2006 017 767.3-55, filed 15 Apr. 2006. This related patent application is herein incorporated by reference in its entirety.

BACKGROUND OF THE INVENTION

Modern computer systems and data processing systems make high demands on the data memories used therein. These memories should be capable of providing extensive data within the shortest possible access time. Fast data memories meeting these requirements are data memories with integrated electronic memory devices such as, for example, so-called DRAM (Dynamic Random Access Memory) chips.

Often, however, memory capacities are demanded which cannot be fulfilled by a single device. A number of memory devices are therefore embedded in familiar manner in a high-capacity memory system. The individual memory device must therefore cooperate with memory controllers and/or other memory devices, ensuring interference-free and time efficient coordination of the data flow. The memory systems comprise a large number of individual memory devices which are produced in high numbers with the aid of complex and highly developed production processes.

In conventional memory systems comprising a number of memory devices, a read request, for example, can be delivered to all memory devices, to a group of memory devices or to a single memory device, wherein the corresponding memory device then outputs the requested data. The individual memory device stores the data in a memory cell array which may require a characteristic time, the latency period, for outputting the requested data. The latency period is thus defined herein as the time interval from the provision of corresponding drive signals to a memory cell array to the actual availability of the requested data.

In spite of the high and optimized reproducibility of established production processes, it is impossible to produce identical devices. Instead, the individual devices are subject to process-related variances which become noticeable mainly with regard to a latency period varying from device to device. Furthermore, fluctuations in the supply voltage and the ambient temperature during the operation also lead to a change in latency period. The said variances are also collectively referred to as PVT (Process Voltage Temperature) variances. The time interval between the request and the reception of the data thus varies.

This varying latency period, which may not be easily controlled per se, in known memory devices may lead to certain restrictions with regard to the time efficiency in the interaction of a number of memory devices: to increase the number of memory devices in a memory system—and thus also the total memory capacity—while simultaneously minimizing the effective access time. The individual memory device should be capable of providing the requested data reliably after a well defined latency period which is constant over the entire operation. If, furthermore, a number of memory devices use a common data bus for outputting the data, for example, when cascaded together, it may become necessary that the individual memory device inserts the data into a data stream at a well defined and determinable time. Otherwise, collisions occur when a memory device outputs data at a time at which data signals are already present at the location of the signal entry. Furthermore, too generous a waiting time between two successive read requests can lead to inadequate loading of the signal path.

SUMMARY OF THE INVENTION

Various embodiments of the present invention may provide particular advantages for an improved method of fabricating a functional layer and an improved method of fabricating an integrated device.

For one embodiment of the present invention, a memory device comprises a memory cell array; an input circuit, the input circuit providing drive signals to the memory cell array dependent on externally received command data; an output buffer, the output buffer buffering data read out from the memory cell array; and a timer, the timer driving the output buffer such that the buffered data are provided at an output after an adjustable time interval has elapsed, the adjustable time interval beginning with the provision of the drive signals.

For one embodiment of the present invention, a memory module comprises at least two memory devices according to an embodiment of the present invention; a command data input, the command data input receiving the command data; a first signal line, the first signal line conducting the command data to the first input of the memory devices; a data output; and a second signal line, the second signal line conducting the data read out from the memory devices to the data output.

For one embodiment of the present invention, a memory module comprises at least two memory devices according to an embodiment of the present invention; a command data input, the command data input receiving the command data; a first signal line, the first signal line conducting the command data to the first input of the memory devices; a data output; a second signal line, the second signal line conducting the data read out from a last memory device to the data output; and a module signal line system, the module signal line system forwarding the command data from the second output of a memory device to the first input of a next memory device and forwarding the data read out from the first output of a memory device to the second input of a next memory device.

For one embodiment of the present invention, a memory controller comprises a command unit, the command unit generating command data for the memory cell array and generating command data for setting the adjustable time interval of the timer of the integrated memory device, the memory controller operating a memory device according to an embodiment of the present invention For one embodiment of the present invention, a memory controller comprises a command unit, the command unit generating command data for setting the adjustable time interval dependent on a maximum count reached; a receiving unit, the receiving unit receiving the counts forwarded from the memory devices; a memory unit, the memory unit buffering the counts reached; and a comparator unit, the comparator unit determining the maximum count reached dependent on the counts reached buffered in the memory unit, the memory controller operating a memory device according to an embodiment of the present invention.

For one embodiment of the present invention, a memory controller comprises a command unit, the command unit generating command data, the command data setting the adjustable time interval dependent on a maximum count; a receiving unit, the receiving unit receiving the counts forwarded from the memory devices; a memory unit, the memory unit buffering the counts; and a comparator unit, the comparator unit determining the maximum count dependent on the counts buffered in the memory unit, the memory controller operating a memory device according to an embodiment of the present invention.

For one embodiment of the present invention, a memory system comprises at least two memory devices according to an embodiment of the present invention; a memory controller according to an embodiment of the present invention; a first signal line tree, the first signal line tree conducting command data from the memory controller to each memory device and a second signal line tree, the second signal line tree conducting data read out from each memory device to the memory controller.

For one embodiment of the present invention, a memory system comprises at least two memory devices according to an embodiment of the present invention; a memory controller according to an embodiment of the present invention; a first signal line system, the first signal line system conducting command data from the memory controller to the first input of a first memory device and forwarding the command data from the second output of memory device to the first input of a next memory device; and a second signal line system, the second signal line system forwarding data read out from the first output of a memory device to the second input of a next memory device and conducting the data read out from the first output of a last memory device to the memory controller.

For one embodiment of the present invention, a memory device comprises a memory cell array; an input circuit, the input circuit providing drive signals to the memory cell array dependent on externally received command data; an output buffer, the output buffer buffering data read out from the memory cell array; a timer, the timer driving the output buffer such that the buffered data are provided at an output after an adjustable time interval has elapsed, the adjustable time interval beginning with the provision of the drive signals; and a chronometer, the chronometer determining a latency period beginning with the reception of a drive signal and ending with an availability of the data read out of the memory cell array.

For further embodiments of the present invention, a method of operating a memory device, a method of operating at least two memory devices, a method of operating a memory controller, and a method of operating a memory system are accordingly provided.

By providing an output buffer and a timer, the memory device according to an embodiment of the present invention allows data which are read out of the memory cell array to be buffered at the time when they are read out from the memory cell array and to be provided only after an adjustable time interval has elapsed after the request. For this purpose, command data are first received by an input circuit and converted to drive signals for the memory cell array. This conversion is independent of the memory cell array and, according to one embodiment, may last an equal length of time. The timer registers the provision of the drive signals and can thus determine the beginning of the adjustable time interval. Starting with the provision of the drive signals, the data to be read out are read out from the memory cell array and provided by it after the latency period. This time interval given by the latency period is subject to the production- and environment-related PVT (Process Voltage Temperature) variances already mentioned above. In general, these may be not predictable or controllable but the actual latency period of a memory device may be measured.

As soon as the data read out are provided by the memory cell array, they are buffered in the output buffer. However, the timer causes the output buffer to output the data read out only after the adjustable time interval has elapsed after the provision of the drive signals. This may ensure that the memory cell array of the memory device has a well-defined effective latency period which may be constant over time and may be adjustable. The adjustable time interval can correspond to an actually measured time interval and also cover a maximum PVT variance. It should also be ensured that the data have been written into the output buffer from the memory cell array in every case before they are output.

According to an embodiment of the present invention, a memory module is provided which comprises at least two memory devices according to an embodiment of the present invention. In this arrangement, the individual memory device comprises a first input for receiving command data and a first output for outputting the data read out. The memory module also comprises a command data input for receiving the command data, a first signal line for conducting the command data to the first input of the memory devices, a data output and a second signal line for conducting the data read out of the memory devices to the data output. Accordingly, command data are provided to all memory devices of the memory module at their respective first inputs so that the input circuits of the memory devices can provide drive signals for the memory cell array. Once the data read out of a memory cell array have been buffered in an output buffer, they are output to the first output of the memory devices after the adjustable time interval has elapsed after the provision of the drive signals. The second signal line collects all data read out of the memory devices and forwards them to the data output of the memory module.

According to an embodiment of the present invention, a memory module is provided which comprises at least two memory devices according to an embodiment of the present invention. Accordingly, the individual memory device comprises, apart from a first input and a first output, a second input and a second output. Furthermore, the memory device according to an embodiment of the invention comprises a first transfer unit for forwarding the command data from the first input to the second output and a second transfer unit for forwarding data from the second input to the first output. The memory module also comprises a command data input for receiving the command data, a first signal line for conducting the command data to the first input of a first memory device, a data output and a second signal line for conducting the data read out from the first output of a last memory device to the data output. The memory module also comprises a module line system for forwarding the command data from the second output of a memory device to the first input of a next memory device and for forwarding the data read out from the first output of a memory device to the second input of a next memory device. According to an embodiment of the present invention, a number of memory devices can thus be cascaded in the memory module. This cascading may begin with the first memory device and may end with the last memory device. Cascading the remaining memory devices between them therefore allows the command data to be forwarded and the data read out to be forwarded from one memory device to the next memory device in the cascaded circuit.

According to an embodiment of present invention, a memory controller for operating at least two memory devices according to an embodiment of the present invention is provided. The memory controller comprises a command unit for generating command data for the memory cell array and for generating command data for setting the adjustable time interval. Accordingly, the memory controller may be capable of adjusting the latency period of each memory device in the form of the adjustable time interval. This may ensure that all memory devices operated by the memory controller have the same latency period. This may enable the memory controller to arrange the data flow between the memory devices and the memory controller in a well defined and efficient manner.

According to an embodiment of the present invention, a memory controller of operating at least two memory devices according to an embodiment of the present invention is provided. The memory controller comprises a command unit for generating command data for setting the adjustable time interval, a receiving unit for receiving the counts forwarded from the memory devices, a memory unit for buffering the counts and a comparison unit for determining a maximum count. Accordingly, the memory controller is capable of receiving the latency period of each memory device in the form of the count reached within the corresponding latency period, determining from this a maximum count and forwarding this maximum count to all timers of the memory devices. This may ensure that all memory devices operated by the memory controller have the same latency period.

According to an embodiment of the present invention, a memory controller of operating at least two memory devices according to an embodiment of the present invention is provided. Accordingly, the memory devices each comprise a first input, a second input, a first output, a second output, a first transfer unit, and a second transfer unit. Accordingly, the first transfer unit forwards command data from the first input to the second output and the second transfer unit forwards data read out from the second input to the first output. Thus, both command data and data read out can be looped through by the memory device according to an embodiment of the present invention. This may allow a number of memory devices to be cascaded and thus the memory devices to be connected to one another in a simple manner.

The memory controller may comprise a command unit for generating command data for setting the adjustable time interval, a receiving unit for receiving the counts forwarded by the memory devices, a memory unit for buffering the counts, and a comparator unit for determining a maximum count. Accordingly, the memory controller may be capable of receiving the latency period of each memory device in the form of the count reached within the corresponding latency period, determining from this a maximum count and forwarding this maximum count to all timers of the memory devices. This may ensure that all memory devices operated by the memory controller have the same latency period.

According to an embodiment of the present invention, a memory system comprises at least two memory devices according to an embodiment of the present invention and a memory controller according to an embodiment of the present invention is provided. Accordingly, the memory system comprises a first and a second signal line tree for conducting command data from the memory controller to each memory device and for conducting the data read out from each memory device to the memory controller. The memory system may allow the data flow from the individual memory devices to the memory controller to be managed reliably and in time-efficient manner. The memory system can therefore provide a high total memory capacity due to a number of memory devices which, in principle, is unlimited, with simultaneous time-efficiency of the information flow and optimum utilization of the signal paths.

According to an embodiment of the present invention, a memory system is provided. Accordingly, the memory system comprises a first signal line system for conducting the command data from the memory controller to the first input of a first memory device and for forwarding the command data from the second output of an memory device to the first input of a next memory device. Furthermore, the memory system comprises a second signal line system for forwarding data read out from the first output of a memory device to the second input of a next memory device and for conducting the data read out from the first output of a last memory device to the memory controller. Accordingly, the memory system may allow the individual memory devices to be cascaded with simultaneous efficient and collision-free control of the information flow within the memory system. Cascading the memory devices also may allow a simple wiring during the technical implementation of such a memory system.

According to an embodiment of the present invention, a method of operating at least two memory devices is provided. In this context, the method comprises the steps of determining the latency period of a memory cell array of each memory device, determining a maximum latency period, and setting the adjustable time interval in dependence on the maximum latency period. The latency period of a memory cell array of each memory device may be first determined and from this a maximum latency period may be obtained. The memory device with the memory cell array having the longest latency period thus may determine the latency period which is used for setting the adjustable time interval. The adjustable time interval may be set in all memory devices and each memory device thus has the same latency period.

According to an embodiment of the present invention, a method of operating a memory controller according to an embodiment of the present invention is provided. The method comprises the steps of receiving at least two forwarded counts, buffering the counts, determining a maximum count and generating command data for setting the adjustable time interval in dependence on the maximum count. The memory controller may request from each memory device the count which was reached during the corresponding latency period, buffer it, and determine from this a maximum count. After that, command data are generated for setting the adjustable time interval which are forwarded to the memory devices. Each memory device thereupon adjusts the adjustable time interval in dependence on the maximum count of all memory devices as determined by the memory controller.

According to an embodiment of the present invention, a method of operating an memory device, a memory system, a memory module or a memory controller, especially according to a previously described embodiment of the present invention, is provided. Accordingly, the latency period of the memory cell arrays of each memory device may be determined and from this a waiting time may be determined. This waiting time determined is conveyed to each memory device. Following this, all data read out of the memory cell array are output after the expiry of the waiting time after a provision of drive signals to the memory cell array. This may ensure a well defined and constant latency period for each memory cell array, thus making it possible to time-efficiently arrange the data flow.

According to an embodiment of the present invention, the timer comprises a counting unit for counting clock cycles of a clock signal after the provision of the drive signals and a register for storing a maximum value. In this arrangement, the timer detects the expiry of the adjustable time interval from a correspondence of the counting unit with the maximum value. Accordingly, the adjustable time interval can be defined in a simple manner by setting the register value and the memory device is capable of detecting the expiry of the adjustable time interval in a precise manner.

According to an embodiment of the present invention, the input circuit sets the maximum value in the register in dependence on command data. The register content, and thus the adjustable time interval, can thus be adjusted externally by corresponding command data which are provided to the input circuit. These command data for setting the maximum value may pass to the memory device via the same signal path as all other command data.

According to an embodiment of the present invention, the input circuit and the timer are arranged in a common clock domain so that both the input circuit and the timer can receive the clock signal synchronously with respect to frequency and phase. Thus, the latency period of the memory cell array, which, in general, may be asynchronous, can be determined by simply counting clock cycles by means of the timer since both the delivery of the drive signals and the counting of the clock cycles up to the availability of the data read out takes place within a clock domain. Additional clock cycles for compensating for any phase shifts between the event determining the beginning—the provision of the drive signals—and the event determining the end—the availability of the data read out—of the latency period may thus be omitted.

According to an embodiment of the present invention, the timer is arranged for determining the latency period from a reception of a drive signal up to an availability of the data read out of the memory cell array. The timer is thus capable of determining the latency period of the memory cell array. Since this varies from device to device and may be also subject to certain fluctuations (PVT variances) during the operation within a device, it may be of advantage that the memory device can determine this latency period.

According to an embodiment of the present invention, the counting unit counts the clock cycles of the clock signal during the latency period and stores the count reached during the latency period in the register. The timer is thus capable of determining the latency period determined in well defined form from a number of clock cycles and storing it. If the clock signal is approximately frequency-synchronous for all memory devices, the counts determined by the timers can be advantageously reliably compared with one another.

According to an embodiment of the present invention, the memory device comprises a first output for outputting the data read out and the timer is arranged for forwarding the count reached to the first output. It is thus possible to output the count, and thus also the latency period determined for the memory cell array of the memory device externally via the first output. Thus, the counts of a number of memory devices can be interrogated by another unit, for instance by a memory controller, and compared with one another.

According to an embodiment of the present invention, the timer is arranged for forwarding the count reached to a further output. According to this embodiment, a separate information path via the further output is provided for outputting the counts in order to relieve the first output, which is also used for outputting the data read out, and provide its full capacity for the transfer of data.

According to an embodiment of the present invention, the memory device comprises a chronometer which is arranged for determining a latency period from a reception of a drive signal to an availability of the data read out of the memory cell array. The chronometer of the memory device enables the latency period of the memory cell array to be measured. The memory device itself can thus determine the latency period, which varies from device to device also within a device during operation as a result of production tolerances.

According to an embodiment of the present invention, the chronometer has a counting unit for counting clock cycles of a clock signal and a register for storing a count reached within the latency period. The latency period measured can thus be represented in well defined manner in the form of a number of clock cycles of a clock signal. If the clock signal is provided to a number of memory devices in approximately frequency-synchronous manner, the counts of a number of memory devices, reached within the latency period, can be compared with one another.

According to an embodiment of the present invention, the input circuit, the chronometer, and the timer are arranged in a common clock domain so that the input circuit, the chronometer, and the timer can receive the clock signal synchronously with respect to frequency and phase.

The chronometer can thus determine the latency period of the memory cell array, which, in general, may be asynchronous, by simply counting clock cycles since both the delivery of the drive signals and the counting of the clock cycles up to the availability of the data read out takes place within a clock domain. Additional clock cycles for compensating for any phase shifts between the event determining the beginning—the provision of the drive signals—and the event determining the end—the availability of the data read out—of the latency period can thus be omitted. Furthermore, the number of clock cycles for which the timer waits until it drives the output buffer for outputting the data read out after the provision of the drive signals then corresponds as accurately as possible to the number of clock cycles determined by the chronometer during the latency period.

According to an embodiment of the present invention, the memory device comprises a first output for outputting the data read out and the chronometer is arranged for forwarding the count reached to this first output. The memory device is thus able to output the count reached, and thus also the latency period of the memory cell array, and thus provide it to other components, such as a memory controller.

According to an embodiment of the present invention, the memory device comprises a further output for outputting the count reached and thus providing the full capacity of the first output for the transfer of data read out.

According to an embodiment of the present invention, the memory device comprises a first input for receiving command data and a first output for outputting the data read out. This makes it possible first to provide command data to the memory device and output data read out via separate paths and thus also simultaneously.

According to an embodiment of the present invention, the memory device also comprises a second input, a second output, a first transfer unit, and a second transfer unit. Accordingly, the first transfer unit forwards command data from the first input to the second output and the second transfer unit forwards data read out from the second input to the first output. Thus, both command data and data read out can be looped through the memory device. Data read out are thus forwarded by other memory devices and command data are also available to the other memory devices. Furthermore, a number of memory devices can be cascaded due to these features. This makes it possible to carry out the required connection of the memory devices with one another by means of signal paths in a simple manner.

According to an embodiment of the present invention, the memory controller comprises an adapting unit for adapting the maximum count by a safety margin and for determining the adjustable time interval. Adapting the maximum count in the sense of increasing it by a safety margin can be carried out by means of an adder by means of adding a safety margin or by a multiplier by means of multiplying for increasing the maximum count by the safety margin. The multiplier allows a relative increase by a safety value in dependence on the actual count in a simple manner. Increasing the maximum count by a safety margin makes it possible to ensure that maximum PVT variances during operation will not lead to the data requested from a memory cell array not yet having arrived in the output buffer and been buffered at the time of the output by the output buffer. To take into consideration maximum PVT variances during operation, the safety margin can be within a range of from 5% to 10% of the maximum latency period.

According to an embodiment of the present invention, the waiting time corresponds to the longest latency period. Thus, each memory device waits from the provision of the drive signals for the memory cell array to the output of the data read out from the output buffer until the memory device with the memory cell array having the longest latency period is also ready to output the data.

According to an embodiment of the present invention, the latency period is determined by measuring the time between the provision of the drive signals to the memory cell array and the availability of the data read out of the memory cell array. In general, providing the drive signals in dependence on the command data and outputting the data read out of the output buffer may take the same length of time. The time thus measured corresponds to the actual latency period of the memory cell array since the provision of the drive signals at the memory cell array determines the beginning of the time interval both in the case of the measurement of the latency period and in the case of a regular access to the memory cell array.

According to an embodiment of the present invention, the method additionally comprises a conversion of the latency period into a set of data or into a set of serial binary data. The latency period determined, e.g. in the form of a count reached within the latency period, can thus be forwarded in the form of normal data via the data path or also forwarded to a further output, e.g. in the form of serial data, in a simple manner and with minimum wiring expenditure, for example to a memory controller for determining a maximum latency period.

According to an embodiment of the present invention, the method comprises an insertion of the data read out of the at least two memory devices into a common data stream. The common data stream, for example in the form of a common signal path can thus be utilized by a number of memory devices. The data can be inserted with bit accuracy so that both collisions and too little loading of the signal paths is prevented.

BRIEF DESCRIPTION OF THE DRAWINGS

These above recited features of the present invention will become clear from the following description, taken in conjunction with the accompanying drawings. It is to be noted, however, that the accompanying drawings illustrate only typical embodiments of the present invention and are, therefore, not to be considered limiting of the scope of the invention. The present invention may admit equally effective embodiments.

FIG. 5 shows a diagrammatic representation of a memory module according to a fifth embodiment of the present invention;

FIG. 6 shows a diagrammatic representation of a memory module according to a sixth embodiment of the present invention;

FIGS. 7A through 7C show a diagrammatic representation of a section of an memory device according to a seventh, eighth, and ninth embodiment of the present invention;

FIG. 8 shows a diagrammatic representation of a memory system according to a tenth embodiment of the present invention;

FIG. 9 shows a diagrammatic representation of a memory system according to an eleventh embodiment of the present invention;

FIG. 12 shows a flow chart of a method according to a fourteenth embodiment of the present invention.

DETAILED DESCRIPTION OF THE PREFERRED EMBODIMENT

Figure 1:
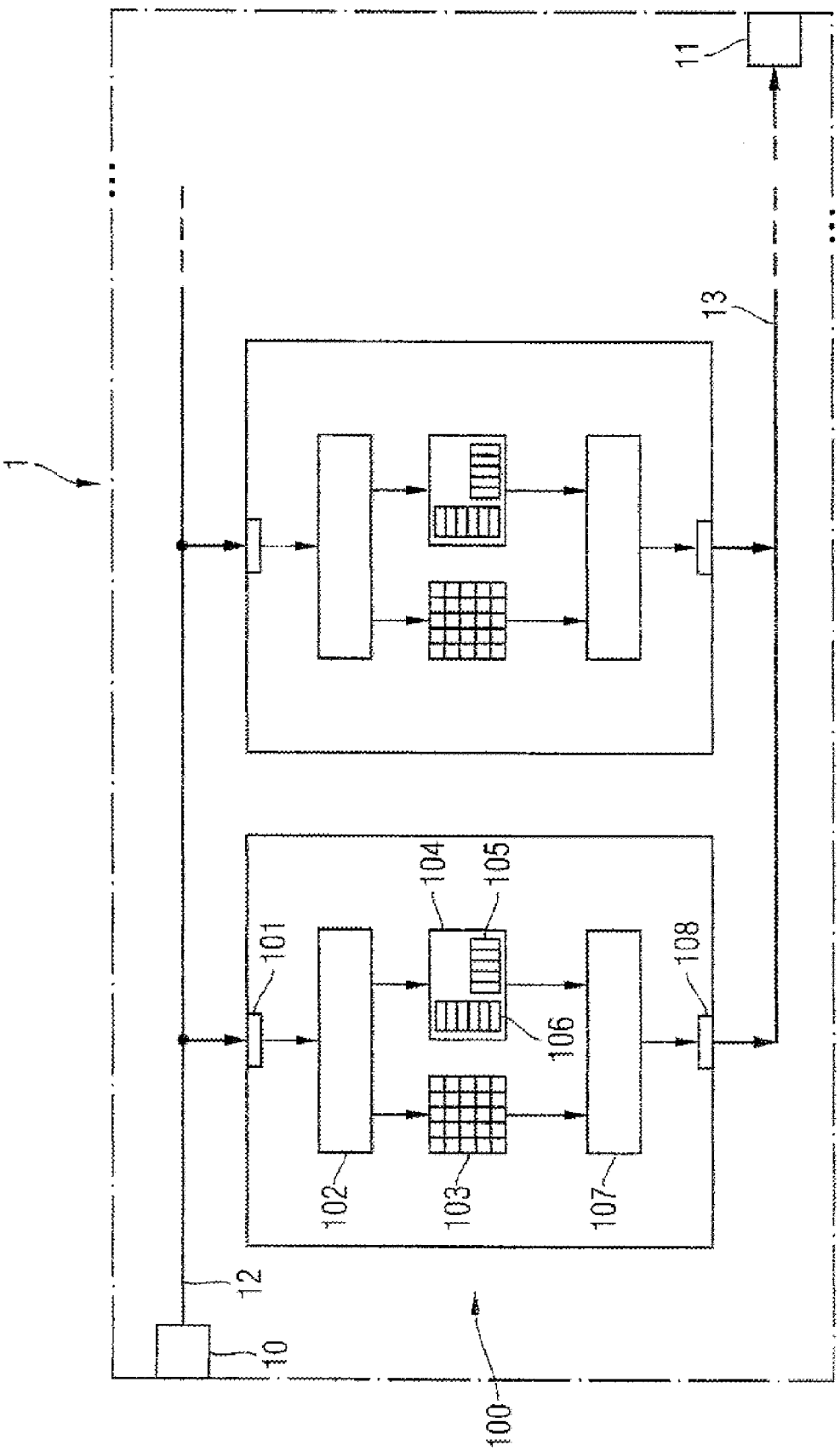
FIG. 1 shows a diagrammatic representation of a memory module according to a first embodiment of the present invention.

FIG. 1 shows a diagrammatic representation of a memory module 1 comprising at least two first memory devices 100. The memory module 1 receives command data, e.g. from a memory controller or a microprocessor, via a command data input 10. The command data are forwarded from the command data input 10 via a first signal line 12 to the memory devices 100. According to this first embodiment of the present invention, any form of parallel circuit is provided. As shown here, the first signal line 12 may comprise branches to the first inputs 101 of the memory devices 100. The command data thus reach the first input 101 and are forwarded to the input circuit 102 within a memory device 100. The input circuit 102 provides drive signals for a memory cell array 103 and a timer 104. The memory cell array 103 outputs data in dependence on drive signals provided to it and provides them to the output buffer 107.

The timer 104 drives the output buffer 107 in such a manner that it outputs the data read out of the memory cell array 103 an adjustable time interval after the provision of the drive signals by the input circuit 102 to a first output 108. For this purpose, the timer 104 has a register 105 and a counting unit 106. The counting unit 106 counts the clock cycles of a clock signal after the provision of the drive signals. The timer 104 determines the expiry of the adjustable time interval from a correspondence of the counting unit 106 with the value stored in the register 105.

The input circuit 102 can give corresponding drive signals to the timer 106 via corresponding command data which are provided externally—for example by a memory controller or microprocessor—to a memory device 100 via the first input 101, so that the timer sets the value of the register 105. The adjustable time interval is thus adjustable externally via the delivery of corresponding command data. The data read out, output by the output buffer 107 to the first output 108, are forwarded to the data output 11 of the first memory module 1 via a second signal line 13. The data read out are forwarded from there, for example to the memory controller, to the microprocessor or to another peripheral.

Figure 2:
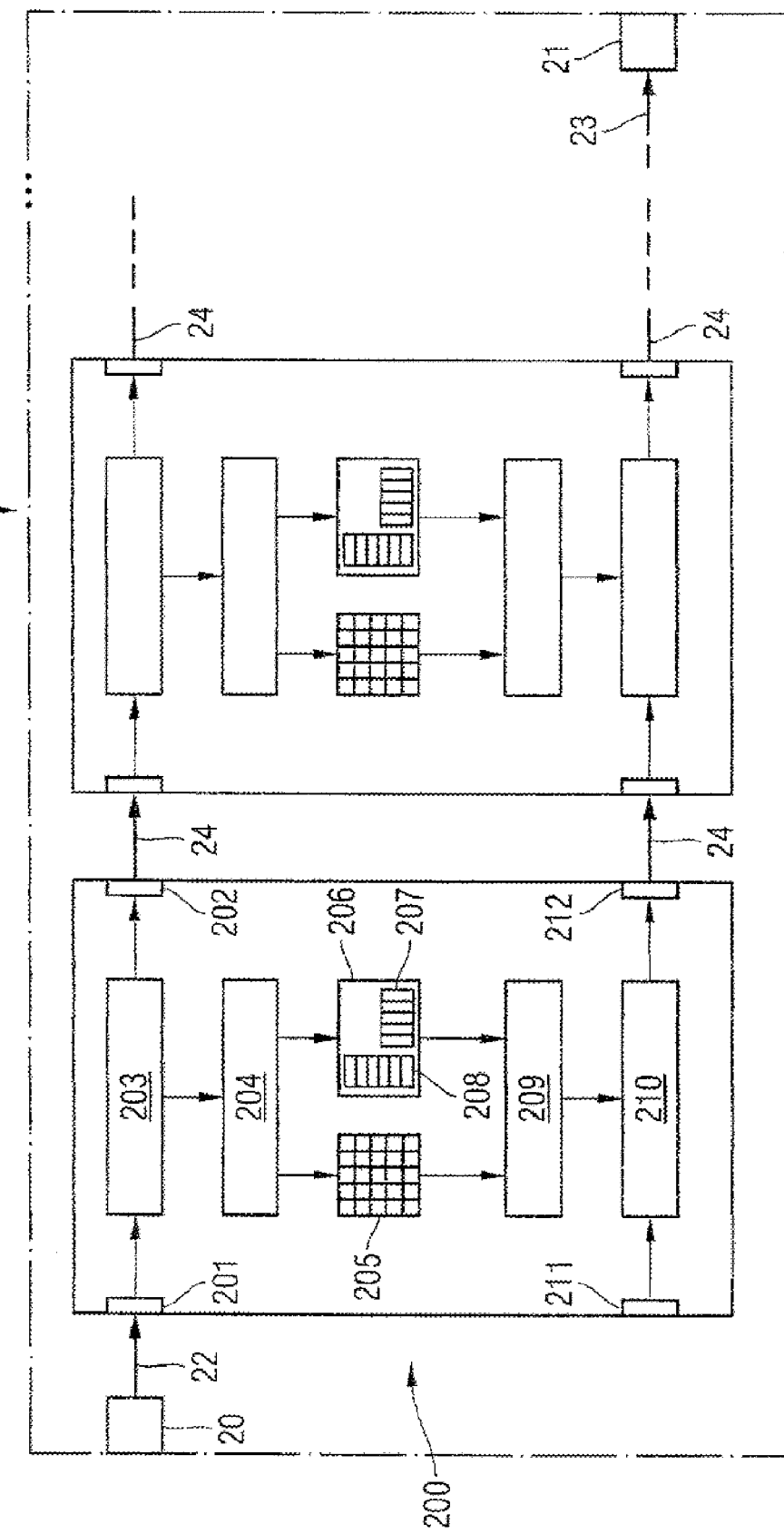
FIG. 2 shows a diagrammatic representation of a memory module according to a second embodiment of the present invention.

FIG. 2 shows a diagrammatic representation of a memory module 2 according to a second embodiment of the present invention. The memory module 2 comprises at least two memory devices 200. A memory device 200 has a first input

201, a first transfer unit 203 and a second output 202 for receiving command data and for forwarding the command data. The transfer unit 203 correspondingly forwards the command data to the second output 202 and/or to the input circuit 204.

Drive signals are provided by the input circuit 204 to a memory cell array 205 and a timer 206. The timer has a register 207 and a counting unit 208 in order to drive an output buffer 209 in such a manner that it outputs the data read out of the memory cell array 205 after the expiry of an adjustable time interval after the provision of the drive signals. The register 207 and the counting unit 208 which counts clock cycles of a clock signal are used for determining the adjustable time interval and its expiry.

The memory device 200 also comprises a second input 211, a second transfer unit 210 and a first output 212. The data read out are forwarded by the output buffer 209 to a second transfer unit 210. The second transfer unit 210 possibly also receives data read out from another memory device 200 via a second input 211 and forwards these and the data from the output buffer 209 to the first output 212. Furthermore, the second transfer unit 210 can ensure that the data read out are inserted with bit accuracy into an existing data stream.

The memory devices 200 according to the second embodiment of the present invention thus allow all memory devices 200 of the second memory module 2 to be cascaded. For this purpose, the second memory module 2 comprises a module signal line system 24 for forwarding both the command data and the data read out from a memory device 200 to a next memory device 200. For this purpose, the module signal line system 24 connects a second output 202 of a memory device 200 to the first input 201 of a next memory device 200 and the first output 212 of a memory device 200 to the second input 211 of a next memory device 200.

Furthermore, the second memory module 2 comprises a first signal line 22 for forwarding the command data from a command data input 20 of the memory module 2 to a first memory device 200 and a second signal line 23 for forwarding the data read out from a last memory device 200 of the memory module 2 to a data output 21 of the memory module 2. Arranging the memory devices 200 in accordance with this embodiment allows the memory devices 200 to be wired to one another in a simple manner in the memory module 2. Furthermore, the total memory capacity of the second memory module 2 can be obtained by further cascading of further memory devices 200.

Figure 3:
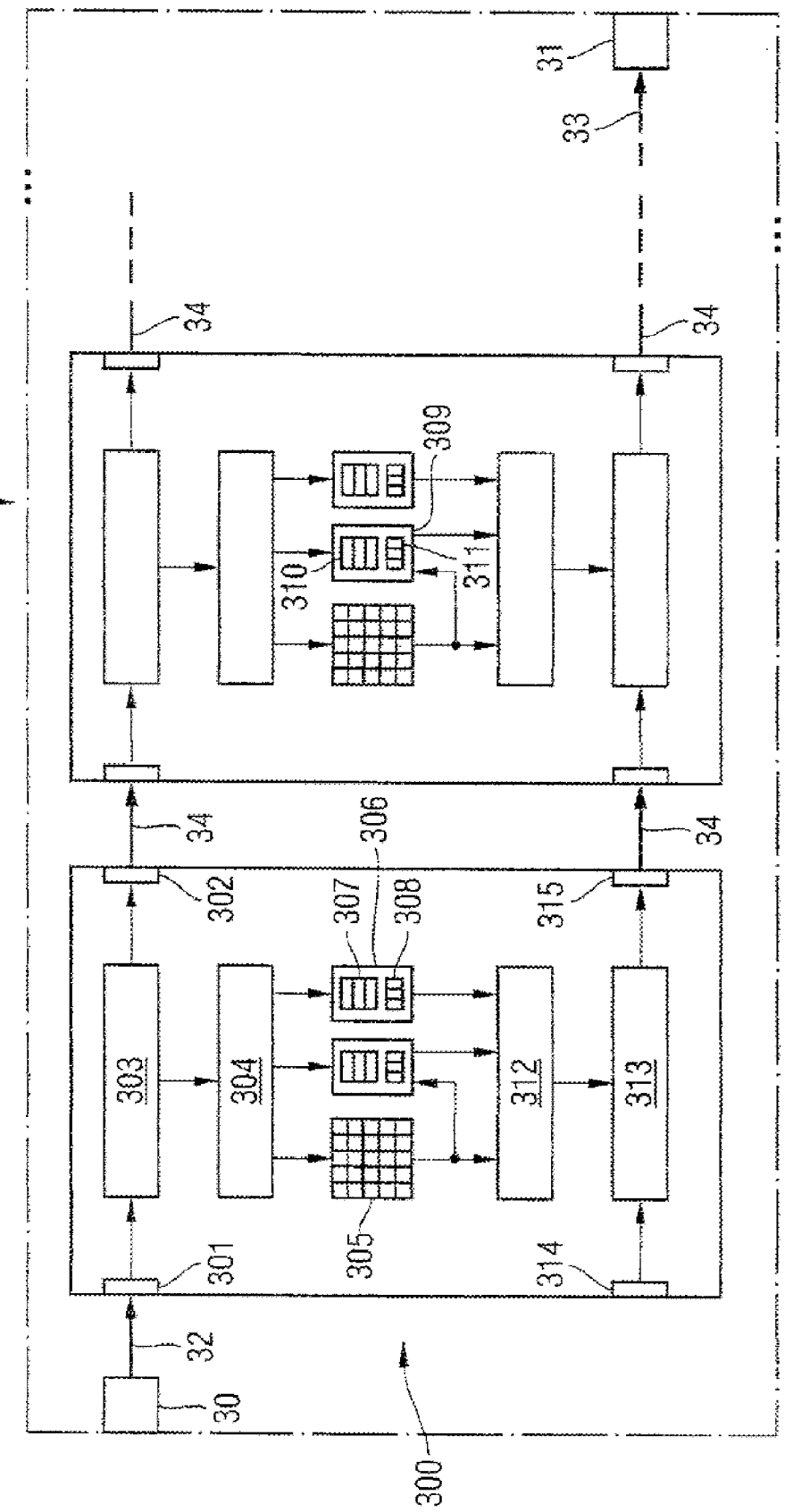
FIG. 3 shows a diagrammatic representation of a memory module according to a third embodiment of the present invention.

FIG. 3 shows a diagrammatic representation of a memory module 3 according to a third embodiment of the present invention. Analogously to the preceding embodiment, the memory module 3 comprises a command data input 30 and a first signal line 32 for forwarding command data from, for example, a memory controller or microprocessor to memory devices 300 of the memory module 3. The data read out of the memory devices 300 are forwarded to a data output 31 of the memory module 3 by a second signal line 33. A module signal line system 34 forwards both the command data and the data read out between the memory devices 300. The memory devices 300 comprise a first input 301, a first transfer unit 303, a second output 302, a second input 314, a second transfer unit 313, and a first output 315 for the through-conduction of the command data and the data read out. The command data forwarded by the first transfer unit 303 to an input circuit 304 are used for providing drive signals for the memory cell array 305, a timer 306 and a chronometer 309. The timer 306 has a register 308 and a counting unit 307 in order to drive the output buffer 312 an adjustable time interval after the provision of the drive signals, in such a manner that the output buffer outputs the data read out of the memory cell array 305. The adjustable time interval is adjusted in accordance with the value set in the register 308. The counting unit 307 counts clock cycles of a clock signal.

The chronometer 309 comprises a register 311 and a counting unit 310. The chronometer 309 is thus capable of measuring the time interval which elapses from the provision of the drive signals for the memory cell array 305 to the availability of the requested data from the memory cell array 305. For this purpose, the chronometer 309 counts the clock cycles of a clock signal by means of the counting unit 310. By means of a corresponding request in the form of command data, the chronometer 309 initiates a measurement of the latency period or the chronometer 309 forwards either the count reached in the counting unit 310 or a count reached during the latency period, which is stored in the register 311, to the second transfer unit 313 either via the output buffer 312 or also directly. Thus, the latency period of the memory cell array 305, determined by the chronometer 309, can be interrogated by the peripheral, for example by a memory controller. The peripheral is thus capable of determining an optimized time interval to be adjusted and to adjust this accordingly for the timers 306 of the memory devices 300.

Figure 4:
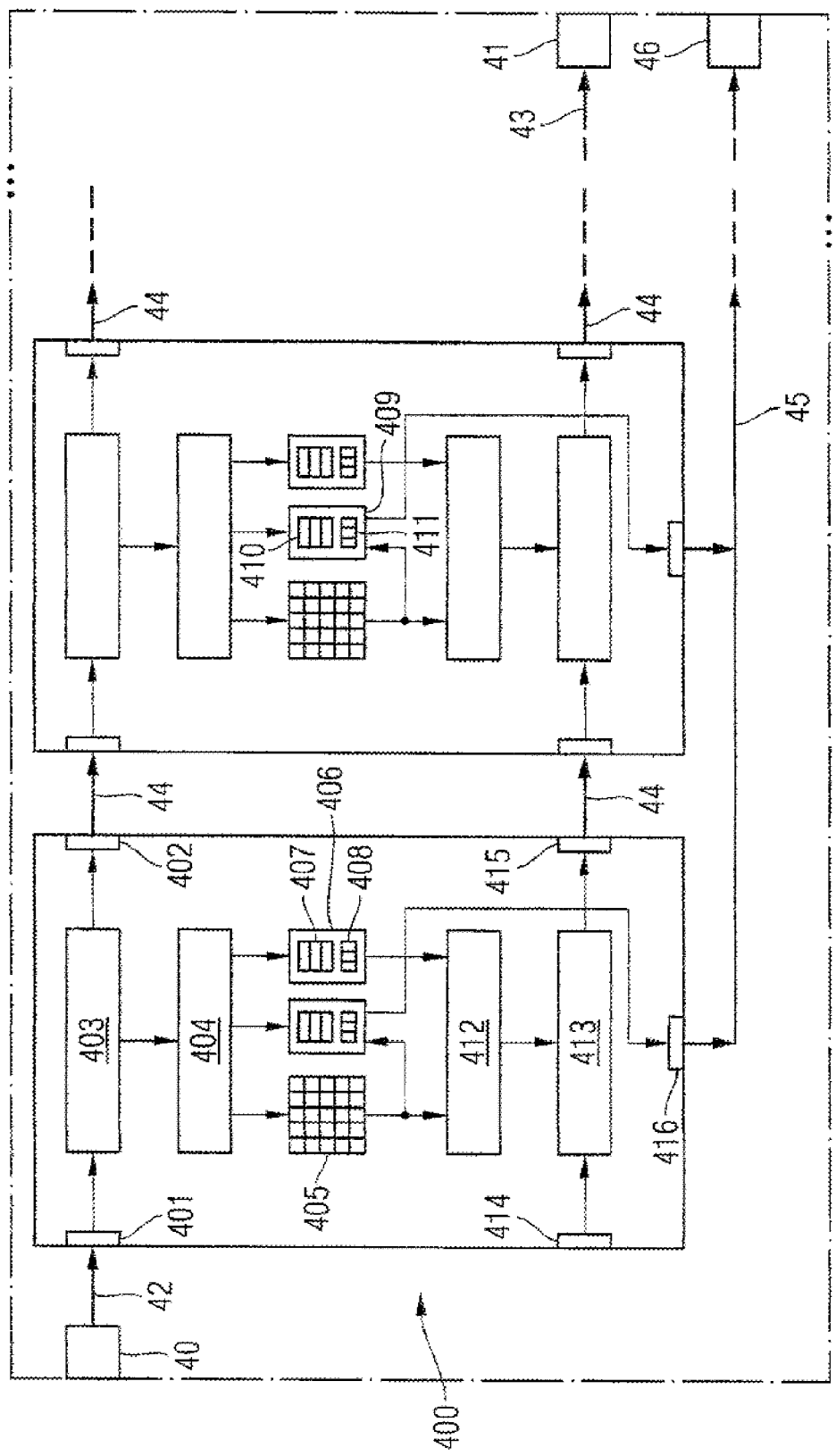
FIG. 4 shows a diagrammatic representation of a memory module according to a fourth embodiment of the present invention.

FIG. 4 shows a memory module 4 according to a fourth embodiment of the present invention. Analogously to the preceding embodiment, a memory module 4 comprises a command data input 40 and a first signal line 42 for forwarding command data to memory devices 400 of the memory module 4. The data read out of the memory devices 400 are forwarded to a data output 41 of the memory module 4 by a second signal line 43. A module signal line system 44 forwards both the command data and the data read out between the memory devices 400. For conducting through the command data and the data read out, the memory devices 400 have a first input 401, a first transfer unit 403, a second output 402, a second input 414, a second transfer unit 413 and a first output 415.

The command data forwarded from the first transfer unit 403 to an input circuit 404 are used for providing drive signals for the memory cell array 405, a timer 406 and a chronometer 409. The timer 406 has a register 408 and a counting unit 407 in order to drive the output buffer 412 an adjustable time interval after the provision of the drive signals in such a manner that it outputs the data read out of the memory cell array 405. The adjustable time interval is adjusted in accordance with the value set in the register 408. The counting unit 407 counts clock cycles of a clock signal. The chronometer 409 comprises a register 411 and a counting unit 410. The chronometer 409 counts clock cycles of a clock signal by means of the counting unit 410. The chronometer 409, by a corresponding request in the form of command data, initiates a measurement of the latency period or the chronometer 409 forwards either the count reached in the counting unit 410 or a count reached during the latency period, which is stored in the register 411.

The memory devices 400 comprise a further output 416. The chronometer 409 can forward the determined latency period of the memory cell array 405 directly to this further output 416. The memory module 4 also comprises a third signal line 45 for forwarding the data output from the further outputs 416 to a measurement data output 46 of the memory module 4. The further outputs 416, the measurement data output 46 and the third signal line 45 can be arranged, for example, for serial or parallel data transmission.

Providing a further signal path for the measurement data from the chronometers 409 of the memory devices 400 allows the measurement data to be transmitted independently of the module signal line system 44 provided for the data and the second signal line 43. The full capacity of the second inputs 414, of the second transfer units 413, of the first outputs 415, of the module line system 44 provided for the data read out, of the second signal line 43 and of the data output 41 may be available for outputting data and may be not impaired or curtailed by the additional flow of measurement data. From the measurement data output 46, the measurement data read out are again forwarded to a memory controller or to a microprocessor.

FIG. 5 shows a diagrammatic representation of a memory module 5 according to a fifth embodiment of the present invention. Analogously to the preceding embodiment, a memory module 5 comprises a command data input 50 and a first signal line 52 for forwarding command data from, for example, a memory controller or microprocessor to memory devices 500 of the memory module 5. The data read out of the memory devices 500 are forwarded to a data output 51 of the memory module 5 by a second signal line 53. A module signal line system 54 forwards both the command data and the data read out between the memory devices 500. For conducting through the command data and the data read out, the memory devices 500 comprise a first input 501, a first transfer unit 503, a second output 502, a second input 511, a second transfer unit 510, and a first output 512. The command data forwarded from the first transfer unit 503 to an input circuit 504 are used for providing drive signals for the memory cell array 505 and a timer 506. The timer 506 has a register 508 and a counting unit 507 for driving the output buffer 509 an adjustable time interval after the provision of the drive signals in such a manner that it outputs the data read out of the memory cell array 505. The adjustable time interval is adjusted according to the value set in the register 508. The counting unit 507 counts clock cycles of a clock signal.

The timer 506 is also capable of measuring the time interval which elapses from the provision of the drive signals for the memory cell array 505 to the availability of requested data from the memory cell array 505. For this purpose, both the drive signals and the data read out or a corresponding signal are provided by the memory cell array 505 for the timer 506. The timer 506 determines the time interval by counting clock cycles of a clock signal by means of a counting unit 507. By means of a corresponding request in the form of command data, the timer 506 initiates a measurement of the latency period or the timer 506 forwards either the count reached in the counting unit 507 or a count reached during the latency period which is stored in the register 508, either via the output buffer 509 or also directly to the second transfer unit 510, or adjusts the adjustable time interval by correspondingly setting the register 508. The memory device 500 can thus handle both the determination of an expiry of an adjustable time interval and the determining of a latency period of the memory cell array 505 by means of one unit, the timer 506. It may be sufficient, therefore, to provide one counting unit 507 and one register 508.

FIG. 6 shows a diagrammatic representation of a memory module 6 according to a sixth embodiment of the present invention. Analogously to the preceding embodiment, a memory module 6 comprises a command data input 60 and a first signal line 62 for forwarding command data from, for example, a memory controller or microprocessor, to memory devices 600 of the memory module 6. The data read out of the memory devices 600 are forwarded to a data output 61 of the memory module 6 by a second signal line 63. A module signal line system 64 forwards both the command data and the data read out between the memory devices 600. For conducting through the command data and the data read out, the memory devices 600 have a first input 601, a first transfer unit 603, a second output 602, a second input 611, a second transfer unit 610 and a first output 612. The command data forwarded from the first transfer unit 603 to an input circuit 604 are used for providing drive signals for the memory cell array 605 and a timer 606. The timer 606 has a register 608 and a counting unit 607 for driving the output buffer 609 an adjustable time interval after the provision of the drive signals in such a manner that it outputs the data read out of the memory cell array 605. The adjustable time interval is adjusted in accordance with the value set in the register 608. The counting unit 607 counts clock cycles of a clock signal.

The timer 606 is also capable of measuring the time interval which elapses from the provision of the drive signals for the memory cell array 605 to the availability of requested data from the memory cell array 605. For this purpose, both the drive signals and the data read out or a corresponding signal from the memory cell array 605 are provided for the timer 606. The timer 606 determines the time interval by counting clock cycles of a clock signal by means of a counting unit 607. By means of a corresponding request in the form of command data, the timer 606 initiates a measurement of the latency period or the timer 606 outputs either the count reached in the counting unit 607 or a count reached during the latency period, which is stored in the register 608.

The memory devices 600 comprise a further output 613. The timer 606 can forward the determined latency period of the memory cell array 605 directly to this further output 613. The memory module 6 also has a third signal line 65 for forwarding the data output from the further outputs 613 to a measurement data output 66 of the memory module 6. The further outputs 613, the measurement data output 66, and the third signal line 65 can be arranged, for example, for serial or parallel data transmission. Providing a further signal path for the measurement data from the timers 606 of the memory devices 600 allows measurement data to be transmitted independently of the module line system 64 provided for the data and the second signal line 63. The full capacity of the second inputs 611, of the second transfer units 610, of the first outputs 612, of the module line system 64 provided for the data read out, of the second signal line 63 and of the data output 61 may thus be available for outputting data and is not impaired or curtailed by the additional flow of measurement data. From the measurement data output 66, the measurement data read out are again forwarded to a memory controller or to a microprocessor. Furthermore, the memory device 600 can thus handle both the determination of an expiry of an adjustable time interval and the determining of a latency period of the memory cell array 605 by means of one unit, the timer 606. It may be thus sufficient to provide one counting unit 607 and one register 608.

FIG. 7A diagrammatically shows a section of a memory device 710, wherein an input circuit 711 and a timer 712 are arranged within a common clock domain 714. The input circuit 711 thus provides drive signals to an asynchronous memory cell array 713 and the timer 712 synchronously with respect to frequency and phase. The timer 712 can thus determine the time of the provision of the drive signals to the memory cell array 713 in an accurate manner. It may be not necessary to provide synchronization clock cycles. The memory device 710 is to be understood to be a development of the first and second embodiment of the present invention as shown in FIGS. 1 and 2 and may replace the memory device 100 and/or the memory device 200, as described there.

FIG. 7B diagrammatically shows a section of a memory device 720, wherein an input circuit 721 and a timer 722 are arranged in a common clock domain 724. The input circuit 721 thus provides drive signals to an asynchronous memory cell array 723 and the timer 722 synchronously with respect to frequency and phase. The timer 722 can thus determine the time of the provision of the drive signals to the memory cell array 713 in an accurate manner. Furthermore, the availability of the data from the memory cell array 723 may be signaled to the timer 722. The timer 722 can thus also determine the latency period needed by the memory cell array 723 for providing the data read out after the provision of the drive signals advantageously without clock loss in clock cycles of the clock domain 722. The memory device 720 is to be understood to be a development of the fifth and sixth embodiment of the present invention as shown in FIGS. 5 and 6 and may replace the memory device 500 and/or memory device 600, as described there.

FIG. 7C diagrammatically shows a section of a memory device 730, wherein an input circuit 731, a chronometer 735, and a timer 732 are arranged in a common clock domain 734. The input circuit 731 thus provides drive signals to an asynchronous memory cell array 733, to the chronometer 735, and to the timer 732 synchronously with respect to frequency and phase. The timer 732 and the chronometer 735 can thus determine the time of the provision of the drive signals to the memory cell array 733 in an accurate manner. Furthermore, the availability of the data from the memory cell array 733 is signaled to the time counter 735. The time counter 735 can thus also determine the latency period needed by the memory cell array 733 for providing the data read out after the provision of the drive signals advantageously without clock loss in clock cycles of the clock domain 732. The memory device 730 is to be understood to be a development of the third and fourth embodiment of the present invention as shown in FIGS. 3 and 4 and may replace the memory device 300 and/or the memory device 400, as described there.

FIG. 8 shows a diagrammatic representation of a memory system 8 comprising a memory controller 810 and at least one memory module 820. The memory controller 810 comprises a command unit 811 for generating command data. The command data are forwarded to the command data input 821 of the at least one memory module 820 via a data feed line 830. A first signal line 823 conducts the command data to each memory device 826 of the memory module 820. From there, the command data pass into the memory device 826 and are converted for read requests, adjustment requests or measurement requests depending on addressing and relevance. The memory devices 826 then output data or measurement data which are forwarded to the memory controller 810 via a second signal line 824, via a data output 822 of the memory module 820 and via a data delivery line 840.

The command unit 811 of the memory controller 810 can send a command for determining the latency period of a memory device 826. For this purpose, corresponding command data are generated by the command unit 811 which are addressed to one or to a group of memory devices. The memory devices 826 thereupon determine their latency period and forward the measurement value determined via the second signal line 824, the data output 822 and the data delivery line 840 to the receiving unit 816 of the memory controller 810. The receiving unit 816 forwards the received measurement values to a memory unit 814 which stores the measurement values in a register 815. From the measurement values stored in the register 815, a comparator unit 813 determines a maximum value. This maximum value then corresponds to the latency period of the slowest memory device 826. This maximum value can then be forwarded directly to the command unit 811 or is first adapted by an adapting unit 812, i.e., for example, increased by a safety margin or recalculated into a number of particular clock cycles. The command unit 811 thereupon generates corresponding command data, by utilizing the maximum latency period or adapted maximum latency period, for adjusting the timers of the memory devices 825. Corresponding command data are again forwarded via the data feed line 830, the command data input 821, the first signal line 823 to the corresponding memory devices 826 of the at least one memory module 820.

The memory module 820 comprises at least one memory device 826 which is arranged in a cascaded circuit on the memory module 820. In this arrangement, the command data from the command data input 821 are provided to the first memory device 826 via a first signal line 823. The data read out are forwarded by a second signal line 824 from the last memory device 826 to the data output 822. The command data and the data read out are forwarded between the memory devices 826 by means of the module signal line system 825.

In the arrangement of the memory devices 826 shown in the memory module 820, the time required may always be the same with identical latency period of the memory cell arrays of the memory devices 826 since the signal flow of a read request in the form of command data may be always conducted via the same data feed line 830, the data input 821, the first signal line 823 and, if necessary, via a number of memory devices 826, and the corresponding parts of the module line system 825 to the corresponding memory device 826. The data read out by this memory device then pass along the signal path via the corresponding parts of the module line system 825, the second signal line 824, the data output 822 and the data delivery line 840. In this arrangement, the data flows via a variable number of memory devices via the module line system 825 at command data level and via a corresponding number of memory devices and via the module signal line system 825 at data level, but always over the entire length of the cascaded memory devices 826 of the memory module 820.

FIG. 9 shows a diagrammatic representation of a memory system 9 according to an eleventh embodiment of the present invention. The memory system 9 comprises a memory controller 910 and at least one memory module 920. The memory controller 910 has a command unit 911 for generating command data. The command data are forwarded to the command data input 921 of the at least one memory module 920 via a data feed line 930. A first signal line 923 conducts the command data to each memory device 925 of the memory module 920. From there, the command data pass into the memory device 925 and are converted for read requests, adjustment requests or measurement requests, depending on addressing and relevance. The memory devices 925 then output data or measurement data which are forwarded to the memory controller 910 via a second signal line 924, via a data output 922 of the memory module 920 and via a data delivery line 940.

The command unit 911 of the memory controller 910 can send a command for determining the latency period of a memory device 925. For this purpose, corresponding command data are generated by the command unit 911 which are addressed to one or to a group of memory devices. The memory devices 925 thereupon determine their latency period and forward the determined measurement value to the receiving unit 916 of the memory controller 910 via the second signal line 924, the data output 922 and the data delivery line 940. The receiving unit 916 forwards the received measurement values to a memory unit 914 which stores the measurement values in a register 915. From the measurement values stored in the register 915, a comparison unit 913 determines a maximum value. This maximum value then corresponds to the latency period of the slowest memory device 925. This maximum value can then be forwarded directly to the command unit 911 or is first adapted by an adapting unit 912, i.e., for example, increased by a safety margin or recalculated into a number of particular clock cycles. The command unit 911 thereupon generates corresponding command data for adjusting the timers of the memory devices 925 by utilizing the maximum latency period or adapted maximum latency period. Corresponding command data are again forwarded to the corresponding memory devices 925 of the at least one memory module 920 via the data feed line 930, the command data input 921, the first signal line 923.

Figure 10:
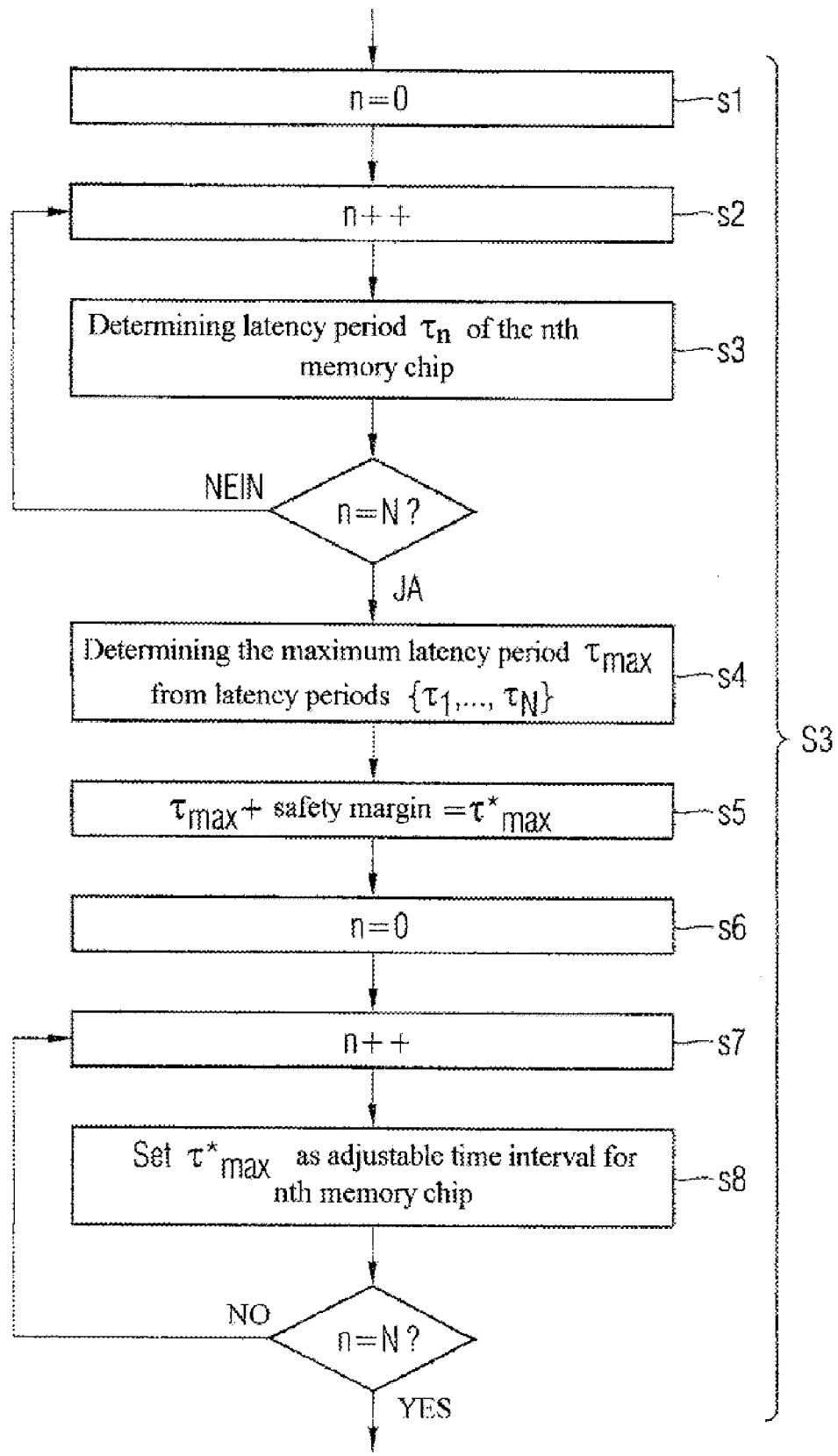
FIG. 10 shows a flow chart of a method according to a twelfth embodiment of the present invention.

FIG. 10 shows a flow chart of the method according to a twelfth embodiment of the present invention. Initially, a loop variable n is set to be equal to zero in a resetting step s1. The loop variable is incremented by one in an incrementing step s2 and assumes all values between 1 and N in the loop, the method here being represented for N memory devices by way of example. Within the loop, the latency period of the $n^{th}$ memory device $\tau_n$ is determined for each n=1 to N. The loop terminates when all latency periods $\tau_1$ to $\tau_N$ of all N memory devices have been determined, i.e. when the loop variable n assumes the value N.

In step s4, a maximum latency period $\tau_{max}$ is determined from the latency periods $\tau_1$ to $\tau_N$ determined. If necessary, a safety margin can be added to this maximum latency period $\tau_{max}$ in order to obtain an adapted maximum latency period $\tau^*_{max}$ in a step s5.

Following this, a loop variable n is again reset in a resetting step s6, i.e. n=0. A second loop is effected, the loop variable n being incremented in each case by 1 in an incrementing step s7. Within the loop, the adapted maximum latency period $\tau^*_{max}$ is set as adjustable time interval for each one of the N memory devices in a step s8. The loop terminates when the time interval has been set for all N memory devices, i.e. when n=N.

Figure 11:
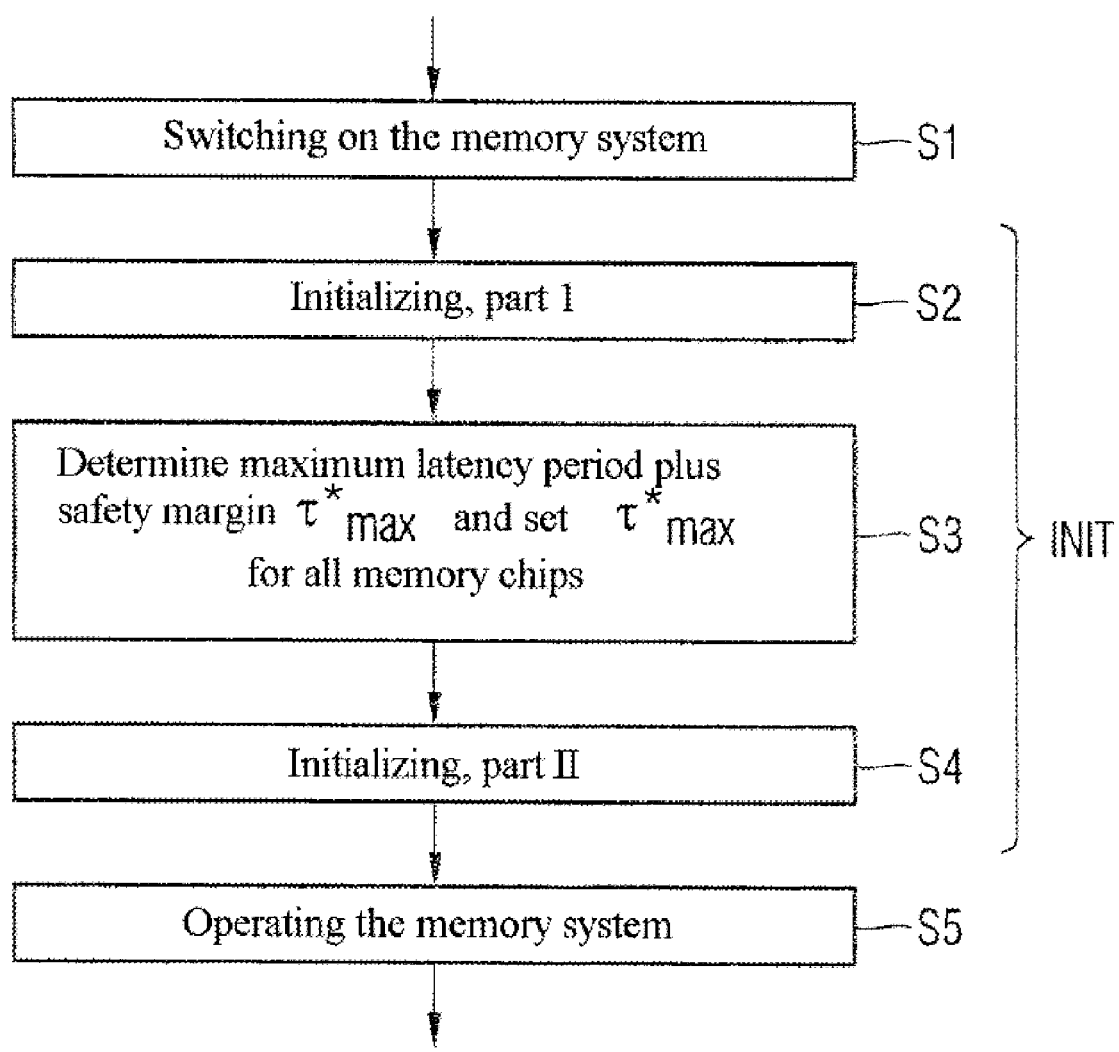
FIG. 11 shows a flow chart of a method according to a thirteenth embodiment of the present invention.

The method described above of steps s1 to s8 is combined as one step S3 for the further FIGS. 10 and 11. The safety margin may be within a range of 5 to 10% of a determined latency period or of the maximum latency period $\tau_{max}$. The safety margin can be added as absolute margin to $\tau_{max}$ in the incrementing step s5 or the latency period $\tau_{max}$ can be multiplied by an incrementing factor for determining the adapted maximum latency period $\tau^*_{max}$. If the method S3 is performed again regularly during operation and the maximum latency period $\tau_{max}$ is thus continuously updated, the adapting or incrementing of the maximum latency period $\tau^*_{max}$ determined for determining an adapted maximum latency period $\tau^*_{max}$ can become unnecessary and thus also be omitted.

FIG. 11 shows a method for operating a memory system according to a thirteenth embodiment of the present invention. The memory system is switched on in a step S1. This is followed by a first part of an initialization of the memory system in a step S2. In a step S3, a maximum latency period plus a safety margin $\tau^*_{max}$ is determined and $\tau^*_{max}$ is set as adjustable time interval for all memory devices of the system, according to the ninth embodiment of the present invention. In a step S4, a second part of the initialization takes place which is followed by the regular operation of the memory system in a step S5. The adapted maximum latency period $\tau^*_{max}$ comprises a safety margin which ensures that all timers of the memory devices wait for a sufficiently long time until the output buffer is caused to output the data read out. During the operation S5, no latency period of a memory device will thus rise above the value of $\tau^*_{max}$ due to PVT variances.

FIG. 12 shows a flow chart of a method for operating a memory system according to a fourteenth embodiment of the present invention. After switching on the memory system (S1), an initialization sequence S2 to S4 takes place. However, deviating from the tenth embodiment of the present invention, $\tau_{max}$ is set as adjustable time interval for all memory devices in step S30 of the initialization. According to this embodiment, regular operation S5 of the memory system takes place after the sequence S2 to S6, whilst a time counter measures the time t and when the time t exceeds a time threshold T, initiates a new determination of the latency period $\tau_{max}$ and the corresponding setting of $\tau_{max}$ for all memory devices in a second step S30. Following this, the time counter t is reset and regular operation of the memory system S5 resumes. The continuous updating of the maximum latency period and the corresponding adjustment of the timers of the memory devices may make it possible to omit the adapting or increasing of the maximum latency period by a safety margin.

The preceding description only describes advantageous exemplary embodiments of the invention. The features disclosed therein and the claims and the drawings can, therefore, be essential for the realization of the invention in its various embodiments, both individually and in any combination. While the foregoing is directed to the embodiments of the present invention, other and further embodiments of this invention may be devised without departing from the basic scope of the invention, the scope of the present invention being determined by the claims that follow.

What is claimed is:

1. A memory device, comprising:
   a memory cell array;
   an input circuit configured to provide drive signals to the memory cell array dependent on externally received command data;
   an output buffer configured to buffer data read out from the memory cell array;
   an output; and
   a timer configured to drive the output buffer such that the buffered data are provided at the output after an adjustable time interval has elapsed, the adjustable time interval beginning with the provision of the drive signals.

2. The memory device as claimed in claim 1, wherein the timer comprises:
   a counting unit configured to count clock cycles of a clock signal after the provision of the drive signals; and
   a register configured to store a maximum value; wherein the timer is configured to detect the expiry of the adjustable time interval from a correspondence of the count clock cycles counted by counting unit with the maximum value.

3. The memory device as claimed in claim 2, wherein the input circuit is configured to set the maximum value in the register dependent on command data.

4. The memory device as claimed in claim 3, wherein the input circuit and the timer are arranged in a common clock domain such that the input circuit and the timer receive the clock signal synchronously in respect to frequency and phase.

5. The memory device as claimed in claim 4, wherein the timer is configured to determine a latency period beginning with the reception of a drive signal and ending with an availability of the data read out of the memory cell array.

6. The memory device as claimed in claim 5, wherein the counting unit is configured to count the clock cycles of the clock signal during the latency period, and the timer is configured to store the count reached within the latency period in the register.

7. The memory device as claimed in claim 6, further comprising a first output configured to output the data read out and wherein the timer is configured to forward the count reached to the first output.

8. The memory device as claimed in claim 6, further comprising a further output; wherein the timer is configured to forward the count reached to a further output.

9. The memory device as claimed in claim 3, further comprising a chronometer configured to determine a latency period beginning with the reception of a drive signal and ending with an availability of the data read out of the memory cell array.

10. The memory device as claimed in claim 9, wherein the chronometer comprises:
a counting unit configured to count clock cycles of a clock signal; and
a register configured to store storing a count reached by the accounting unit within the latency period.

11. The memory device as claimed in claim 10, wherein the input circuit, the chronometer, and the timer are arranged in a common clock domain such that the input circuit, the chronometer, and the timer receive the clock signal synchronously in respect to frequency and phase.

12. The memory device as claimed in claim 11, further comprising a first output configured to output the data read out from the memory cell array; wherein the chronometer is configured to forward the count reached to the first output.

13. The memory device as claimed in claim 11, further comprising a further output; the chronometer being configured to forward the count reached to the further output.

14. The memory device as claimed in claim 1, further comprising a first input and a first output, the first input being configured to receive command data and the first output being configured to output the data read out from the memory cell array.

15. The memory device as claimed in claim 14, further comprising:
a first transfer unit;
a second transfer unit;
a second input; and
a second output; wherein the first transfer unit is configured to forward the command data from the first input to the second output and to the input circuit, and the second transfer unit is configured to forward data from the output buffer and from the second input to the first output.

16. A memory module, comprising:
at least two memory devices, comprising:
a memory cell array;
an input circuit configured to provide drive signals to the memory cell array dependent on externally received command data;
an output buffer configured to buffer data read out from the memory cell array;
a timer configured to drive the output buffer such that the buffered data are provided at an output after an adjustable time interval has elapsed, the adjustable time interval beginning with the provision of the drive signals;
a first input configured to receive command data; and
a first output configured to output the data read out from the memory cell array;
the memory module further comprising:
a command data input configured to receive the command data;
a first signal line configured to transmit the command data to the first input of the memory devices;
a data output; and
a second signal line configured for transmitting the data read out from the memory devices to the data output.

17. A memory module, comprising:
at least two memory devices, the memory devices comprising:
a memory cell array;
an input circuit configured to provide drive signals to the memory cell array dependent on externally received command data;
an output buffer configured to buffer data read out from the memory cell array;
a timer configured to drive the output buffer such that the buffered data are provided at an output after an adjustable time interval has elapsed, the adjustable time interval beginning with the provision of the drive signals;
a first input configured to receive command data;
first output configured to output the data read out from the memory cell array;
a first transfer unit;
a second transfer unit;
a second input; wherein the second transfer unit is configured to forward data from the output buffer and from the second input to the first output; and
a second output; wherein the first transfer unit is configured to forward the command data from the first input to the second output and to the input circuit;
the memory module further comprising:
a command data input configured to receive the command data;
a first signal line configured to transmit the command data to the first input of the memory devices;
a data output;
a second signal line configured to transmit the data read out from a last memory device to the data output; and
a module signal line system configured to forward the command data from the second output of a respective one of the memory devices to the first input of a next one of the memory devices and further configured to forward the data read out from the first output of a respective one of the memory devices to the second input of a next one of the memory devices.

18. A method of operating at least two memory devices, the memory devices comprising:
a memory cell array;
an input circuit, the input circuit providing drive signals to the memory cell array dependent on externally received command data;
an output buffer, the output buffer buffering data read out from the memory cell array; and
a timer, the timer driving the output buffer such that the buffered data are provided at an output after an adjustable time interval has elapsed, the adjustable time interval beginning with the provision of the drive signals,
the method comprising:
determining a latency period of the memory cell array of each memory device;
determining a maximum latency period; and
setting the adjustable time interval dependent on the maximum latency period.

19. The method as claimed in claim 18, further comprising increasing the maximum latency period by a safety margin.

20. A memory device comprising:
a memory cell array;
an input circuit, the input circuit providing drive signals to the memory cell array dependent on externally received command data;

an output buffer, the output buffer buffering data read out from the memory cell array;

a timer, the timer driving the output buffer such that the buffered data are provided at an output after an adjustable time interval has elapsed, the adjustable time interval beginning with the provision of the drive signals; and a chronometer, the chronometer determining a latency period beginning with the reception of a drive signal and ending with an availability of the data read out of the memory cell array.

21. The memory device as claimed in claim 20, wherein the chronometer comprises a counting unit and a register, the counting unit counting clock cycles of a clock signal and the register storing a count reached within the latency period.

22. The memory device as claimed in claim 21, further comprising a first output, the first output outputting the data read out from the memory cell array, and the chronometer forwarding the count reached to the first output.

23. The memory device as claimed in claim 21, further comprising a further output, the chronometer forwarding the count reached to the further output.

24. The memory device as claimed in claim 22, wherein the input circuit, the chronometer, and the timer are arranged in a common clock domain such that the input circuit, the chronometer, and the timer receive the clock signal synchronously in respect to frequency and phase.

25. The memory device as claimed in claim 23, wherein the input circuit, the chronometer, and the timer are arranged in a common clock domain such that the input circuit, the chronometer, and the timer receive the clock signal synchronously in respect to frequency and phase.

* * * * *